United States Patent [19]

Hughes

[11] 3,745,474

[45] July 10, 1973

[54] HIGH SPEED LOGARITHMIC VIDEO AMPLIFIER

[75] Inventor: Richard Smith Hughes, Ridgecrest, Calif.

[73] Assignee: The United States of America as represented by the Secretary of the Navy, Washington, D.C.

[22] Filed: Dec. 20, 1971

[21] Appl. No.: 209,839

[52] U.S. Cl. .................. 328/145, 307/230

[51] Int. Cl. .................. G06g 7/24

[58] Field of Search .................. 307/229, 230; 328/145

[56] References Cited

UNITED STATES PATENTS

| | | | |
|---|---|---|---|
| 2,577,506 | 12/1951 | Belleville | 328/145 |
| 3,403,347 | 9/1968 | Stull, Jr. | 328/145 X |
| 3,605,027 | 9/1971 | Nichols et al. | 328/145 |
| 3,668,535 | 6/1972 | Lansdowne | 328/145 X |

*Primary Examiner*—Stanley D. Miller, Jr.
*Attorney*—R. Sciascia, Roy Miller and Robert W. Adams

[57] ABSTRACT

A multistage, parallel summation, logarithmic video amplifier, capable of handling very short pulses in which linear amplifier(s) are used in each stage as delay device(s) such that all of the stages simultaneously provide their output in response to each input pulse.

1 Claim, 2 Drawing Figures

PATENTED JUL 10 1973

3,745,474

HIGH SPEED LOGARITHMIC VIDEO AMPLIFIER

BACKGROUND OF THE INVENTION

Saturation is one of the fundamental limitations to the maximum usefulness of any system employing linear amplification. The input and output dynamic range for linear amplifiers is limited at the low end by the signal-to-noise (S/N) ratio wanted at the high end by saturation. The output of the linear amplifier must usually exceed a given threshold before it is usable. Thus the output dynamic range will be the saturation level minus the threshold level.

The total input dynamic range for linear amplifiers may be increased by the use of variable gain control, i.e., lower the gain as the output nears saturation; however, the instantaneous input dynamic range for most linear amplifiers is usually less than 30 db, which is too low for many applications. The term db is defined as: db = 20 log X, where X is any real number greater than zero. This limited input dynamic range may be greatly increased by the use of logarithmic amplifiers.

It is possible to obtain input dynamic ranges greater than 100 db with properly designed logarithmic amplifiers. The output dynamic range of logarithmic amplifiers has the same constraints as linear amplifiers, i.e, 20 to 30 db. Thus the logarithmic amplifier instantaneously compresses a large input dynamic range into a small output dynamic range.

The input dynamic range of a logarithmic amplifier is of primary importance in many designs. The input dynamic range is limited by the input thermal noise at the low end and by saturation of the logarithmic amplifier on the high end. The output dynamic range is defined as the ratio of the maximum output (where the output starts deviating from a logarithmic response) to the minimum output (where the output enters the logarithmic response).

The present invention relates to the field of logarithmic video amplifiers and, in particular, high speed logarithmic amplifiers, i.e., those having a fast rise time. Most logarithmic video amplifiers have rise times ranging from 25 to 150 nsec. Certain applications, such as high-resolution radar receivers, require rise time below 10 to 15 nsec. These rise times are difficult, if not impossible to obtain for large dynamic ranges.

FIG. 1 illustrates the general form of the parallel-summation logarithmic video amplifier. The rise time for this amplifier is a function of the input intensity which is due to the difference in time delay the pulse encounters as it passes through the linear stages. At low intensities the upper level log stages, such as stage 10, contribute little to the output response and the delay makes little difference. However, as the input is increased, the upper level log stages are summed before the lower level stages, due to the time delay associated with the linear amplifiers A of stages 10–16.

SUMMARY OF THE INVENTION

Typically, parallel summation, logarithmic video amplifiers are multistage with each stage having a linear amplifier, an attenuator coupled to the linear amplifier, and a logarithmic amplifier coupled to the attenuator. Each successive stage is also coupled to the linear amplifier of the preceding stage. And, the outputs of all of the logarithmic amplifiers are summed to form the response which approximates a logarithmic function of the input signal.

When the input is an ultrashort pulse the typical logarithmic video amplifier is unable to provide a meaningful output because of the inherent delays in the system.

The present invention is able to provide a meaningful output in response to an input of ultrashort pulses. If a delay line composed of one or more linear amplifiers is selectively added to each stage the outputs of all the stages can be made to occur simultaneously in response to each input pulse. The number of linear amplifiers added to each stage is equal to the number of succeeding stages.

DESCRIPTION OF THE PREFERRED EMBODIMENT

There are many ways to obtain the logarithmic response of an input signal. However, all prior devices fail when the input signal is a series of ultrashort pulses. The present invention provides an accurate logarithmic response of an input signal consisting of ultrashort pulses.

Figure 1:
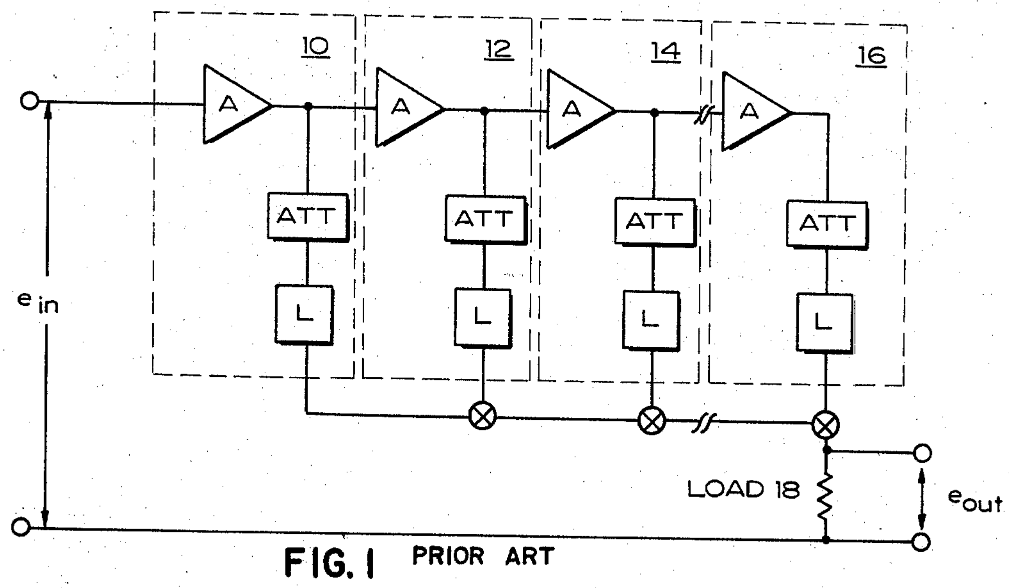
FIG. 1 PRIOR ART
FIG. 1 is a block diagram of the general form of a multistage, parallel summation, logarithmic video amplifier.

FIG. 1 shows the general form of a multistage, parallel summation, logarithmic video amplifier which consists of stages 10–16 and load 18. The output currents of all the stages are combined to give an approximation of a true logarithmic response over a wide dynamic range of inputs. Each stage of the generalized logarithmic amplifier consists of a linear amplifier A, an attenuator ATT, and a logarithmic amplifier L that has logarithmic input-output characteristics over a dynamic range specified by its transfer function.

The linear amplifiers and attenuators are selected to phase in each log stage sequentially as a function of input intensity. The resultant composite output of the stages approximates a true logarithmic response.

When the input signal is a series of ultrashort pulses the output of the device of FIG. 1 will not approximate a true logarithmic response. The deficiency is the result of the inherent time delay caused by the linear amplifiers A. As a result, the pulse being logged appears at the logarithmic amplifiers L of stages 10–16 at different times. Thus, when trying to log a narrow pulse, the highest level logarithmic amplifier L of stage 10 will begin logging before the lowest level logarithmic amplifier L of stage 16. The result is severe pulse distortion which destroys the logarithmic response.

Figure 2:
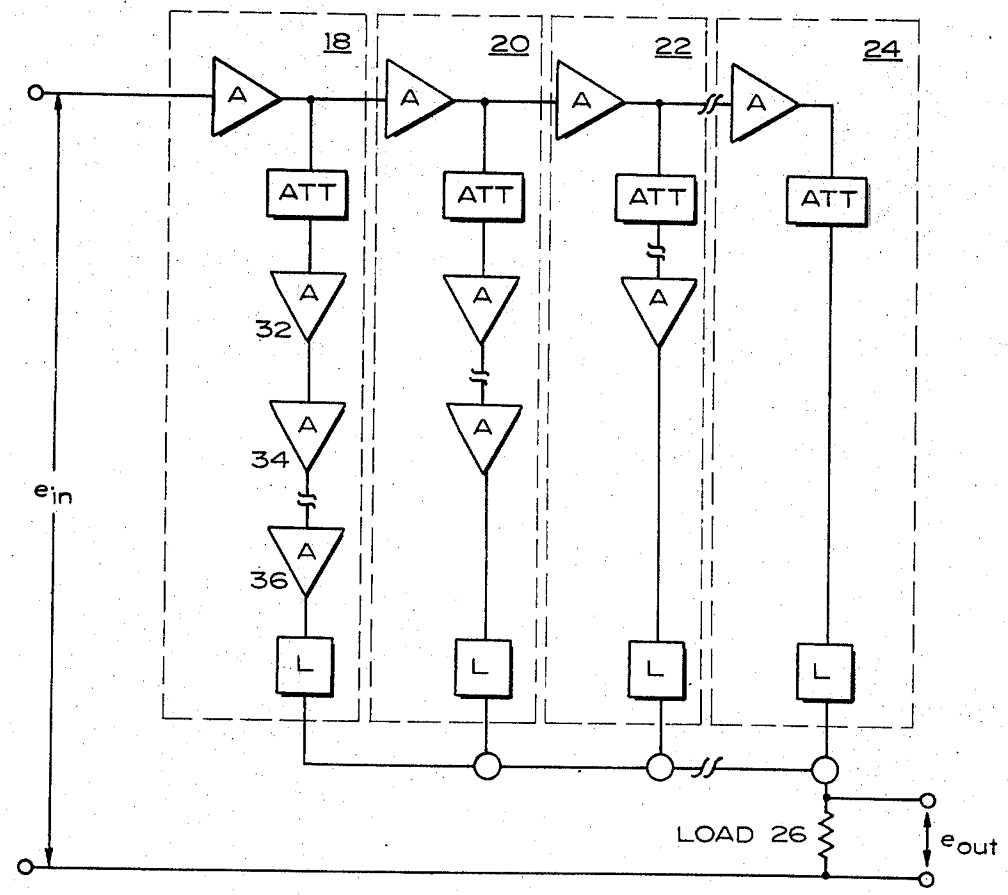
FIG. 2 is a block diagram of the present invention.

The present invention shown in FIG. 2 overcomes the problems inherent in the device of FIG. 1 by selectively adding the appropriate delay to each stage of the system. That is, an appropriate delay is added to each stage to cause the outputs of all of the stages to occur simultaneously.

The present invention shown in FIG. 2 may have any number of stages, such as stages 18, 20, 22, and 24. Each stage is composed of at least a first amplifier A (shown in stage 18 as element 30), attenuator ATT, and logarithmic amplifier L. Stage 18 additionally includes amplifiers A (shown in stage 18 as elements 32, 34, and 36) as delay devices coupled between attenuator ATT and logarithmic amplifier L. Since the delay devices are used to delay stage 18 an amount equal to the period of delay before the logarithmic amplifier L of stage 24 receives the input pulse, the number of delay amplifiers included are equal to the number of succeeding stages in the system. That is, if there are four stages in the system (three succeeding stages) the first stage will include three delay amplifiers, the second will include two delay amplifiers, the third stage one delay amplifier. And, in the fourth stage, the logarithmic amplifier L will be coupled directly to the attenuator ATT.

The invention operates as follows: all of the linear amplifiers A cause an inherent delay in any signal which they process. Therefore, the ultrashort pulse input $e_{in}$ is delayed by linear amplifier A of stage 18 before it is coupled to stage 20. Linear amplifier A of stage 20 likewise delays the input before it is coupled to stage 22, and so on. The output of linear amplifier A of stage 18 is additionally coupled through attenuator ATT and linear amplifiers 32, 34, and 36 to logarithmic amplifier L. Linear amplifier 32 provides a delay equivalent to the delay inherent in linear amplifier A of stage 20, linear amplifier 34 provides a delay equivalent to the delay inherent in linear amplifier A of stage 22, and linear amplifier 36 provides a delay equivalent to the delay inherent in linear amplifier A of stage 24. Thereby, since each succeeding stage has one less delay device the outputs of all of the logarithmic amplifiers L occur simultaneously. The outputs are summed to form the response which approximates a logarithmic function of the input signal and provided to load 26. The system output is taken across load 26.

What is claimed is:

1. An amplifier providing an output signal which is a logarithmic function of the input signal, comprising:

a plurality of amplification stages wherein each stage, except the last stage, includes means for delaying that stage output such that the outputs of all the stages occur simultaneously, including a first stage having first phasing means coupled to said input signal for phasing the first stage as a function of the input signal intensity, first amplifying means coupled to said first phasing means for delaying the input signal processed by said first phasing means, and second amplifying means coupled to the output of said first amplifying means for providing an output which is a logarithmic function of the delayed input signal processed by said first phasing means, a second stage including a second phasing means coupled to an output of the first phasing means for phasing the second stage as a function of said first phasing means output intensity, third amplifying means coupled to said second phasing means for delaying said first phasing means output processed by said second phasing means, and fourth amplifying means coupled to the output of said third amplifying means for providing an output which is a logarithmic function of the delayed said first phasing means output processed by said second phasing means; and combining means coupled to the outputs of the plurality of stages for summing their outputs and providing a system output which is a logarithmic function of said input signal.

* * * * *